United States Patent
Reusch et al.

(10) Patent No.: US 10,454,472 B2
(45) Date of Patent: Oct. 22, 2019

(54) BOOTSTRAP CAPACITOR OVER-VOLTAGE MANAGEMENT CIRCUIT FOR GAN TRANSISTOR BASED POWER CONVERTERS

(71) Applicant: Efficient Power Conversion Corporation, El Segundo, CA (US)

(72) Inventors: David C. Reusch, Blacksburg, VA (US); John Glaser, Niskayuna, NY (US); Michael A. de Rooij, Playa Vista, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 15/824,275

(22) Filed: Nov. 28, 2017

(65) Prior Publication Data

US 2018/0159529 A1    Jun. 7, 2018

Related U.S. Application Data

(60) Provisional application No. 62/428,854, filed on Dec. 1, 2016.

(51) Int. Cl.
*H03B 1/00*     (2006.01)
*H03K 3/00*     (2006.01)
(Continued)

(52) U.S. Cl.
CPC ......... *H03K 17/6871* (2013.01); *G05F 1/571* (2013.01); *H01L 29/2003* (2013.01);
(Continued)

(58) Field of Classification Search
CPC ......... H03K 17/6871; H03K 17/04206; H03K 17/063; H03K 17/08122; H03K 17/567; H03K 2217/0081; H03K 2217/0063; H03K 2217/0072; H02M 3/158; H02M 2001/0006; H02M 1/32;
(Continued)

(56) References Cited

U.S. PATENT DOCUMENTS 4,760,282 A     7/1988  Kuo et al.
5,373,435 A *  12/1994  Jayaraman ............ H02M 7/538
                                                            363/17

(Continued)

FOREIGN PATENT DOCUMENTS

TW     201448428 A    12/2014
TW     I528690 B       4/2016

OTHER PUBLICATIONS

Fairchild Application Note AN-6076, "Design and Application Guide of Bootstrap Circuit for High-Voltage Gate-Drive IC," Fairchild Semiconductor Corporation (2008).

*Primary Examiner* — Metasebia T Retebo
(74) *Attorney, Agent, or Firm* — Blank Rome LLP

(57) ABSTRACT

A drive circuit for a half bridge transistor circuit formed of enhancement mode GaN transistors. A shunt diode is connected to the bootstrap capacitor at a node between the bootstrap capacitor and ground, the shunt diode being decoupled from the midpoint node of the half bridge by a shunt resistor. The shunt diode advantageously provides a low voltage drop path to charge the bootstrap capacitor during the dead-time charging period when both the high side and low side transistors of the half bridge are off.

15 Claims, 18 Drawing Sheets

(51) Int. Cl.
*H03K 17/687* (2006.01)
*G05F 1/571* (2006.01)
*H01L 29/20* (2006.01)
*H02M 3/158* (2006.01)
*H03K 17/042* (2006.01)
*H03K 17/06* (2006.01)
*H03K 17/0812* (2006.01)
*H03K 17/567* (2006.01)
*H02M 1/32* (2007.01)
*H02M 1/00* (2006.01)

(52) U.S. Cl.
CPC ...... *H02M 3/158* (2013.01); *H03K 17/04206* (2013.01); *H03K 17/063* (2013.01); *H03K 17/08122* (2013.01); *H03K 17/567* (2013.01); *H02M 1/32* (2013.01); *H02M 2001/0003* (2013.01); *H02M 2001/0006* (2013.01); *H03K 2217/0063* (2013.01); *H03K 2217/0072* (2013.01); *H03K 2217/0081* (2013.01); *Y02B 70/1483* (2013.01)

(58) Field of Classification Search
CPC ............ H02M 2001/0003; G05F 1/571; H01L 29/2003; Y02B 70/1483
USPC ........................................................ 327/108
See application file for complete search history.

(56) References Cited

U.S. PATENT DOCUMENTS

| | | | |
|---|---|---|---|
| 5,408,150 A * | 4/1995 | Wilcox | H02M 1/38 326/104 |
| 8,536,847 B2 | 9/2013 | Liang | |
| 8,593,211 B2 | 11/2013 | Forghani-Zadeh et al. | |
| 8,619,445 B1 | 12/2013 | Low et al. | |
| 9,136,836 B2 | 9/2015 | Chen et al. | |
| 9,667,245 B2 | 5/2017 | de Rooij et al. | |
| 2003/0151447 A1* | 8/2003 | Moriconi | H02M 3/155 327/536 |
| 2008/0290841 A1* | 11/2008 | Chang | H02J 7/0068 320/166 |
| 2010/0135675 A1* | 6/2010 | Tanaka | H01S 5/06213 398/192 |
| 2012/0262144 A1* | 10/2012 | Lyons | H05B 33/0815 323/311 |
| 2013/0038259 A1* | 2/2013 | Andersen | H02P 1/029 318/400.28 |
| 2016/0079785 A1 | 3/2016 | Kinzer et al. | |
| 2016/0105173 A1* | 4/2016 | De Rooij | H03K 17/6871 327/109 |

* cited by examiner

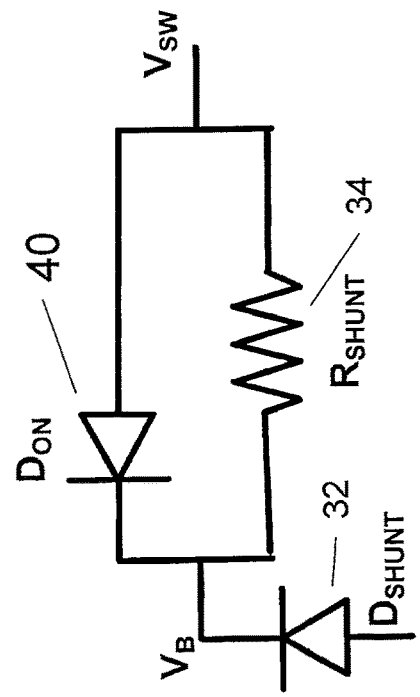
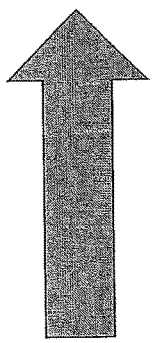
FIG 4A
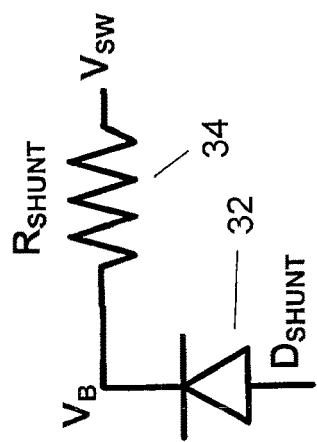

BOOTSTRAP CAPACITOR OVER-VOLTAGE MANAGEMENT CIRCUIT FOR GAN TRANSISTOR BASED POWER CONVERTERS

This application claims the benefit of U.S. Provisional Application No. 62/428,854, filed Dec. 1, 2016, the entire disclosure of which is hereby incorporated by reference in its entirety.

BACKGROUND OF THE INVENTION

Since their inception, normally off enhancement mode (e-mode) gallium nitride (GaN) transistors have demonstrated superior in-circuit performance compared to conventional silicon technologies. E-mode GaN transistors, and wide bandgap power devices in general, are capable of higher performance than silicon MOSFET technology and have led to the development of improved applications fundamentals to fully utilize the capability of the superior power devices and better optimize designs around the unique device properties.

For e-mode GaN transistors, one distinct device property is a lower maximum gate voltage capability when compared to standard silicon MOSFETs. Specifically, the gate overhead margin, which is defined as the difference between the manufacturers recommended gate voltage and the maximum gate voltage of the device, is small for e-mode GaN transistors, compared to their silicon MOSFET predecessors. Accordingly, when e-mode GaN transistors, particularly non-ground referenced e-mode GaN transistors, are driven, gate drive circuits must be designed so as to avoid the exceeding maximum gate drive voltage of the transistor.

For many power electronics topologies, a non-ground referenced power transistor is used, including the half bridge based topologies such as synchronous buck, synchronous boost, isolated full bridge, isolated half bridge, LLC, and many others. The gate voltage for the non-ground referenced device is generated using a bootstrap circuit—the circuit, current flow, and timing diagram for a buck converter configuration are shown in FIGS. 1A, 1B-1D, and 1E, respectively.

As shown in FIG. 1A, the conventional buck converter bootstrap driver circuit includes a pair of transistors 12 and 14 labeled Q1 and Q2. Typically, the transistors 12 and 14 are referred to as high side and low side switches, respectively. The source of high side transistor 12 is coupled to the drain of low side transistor 14 at the half bridge output ($V_{SW}$). The drain of high side transistor 12 is coupled to a high voltage source 18 ($V_{IN}$), and the source of low side transistor 14 is coupled to ground. Furthermore, the gate of high side transistor 12 is coupled to the gate drive output GH of a gate driver IC, and the gate of low side transistor 14 is coupled to the gate drive output GL of the gate driver IC. Gate drivers are well-known in the art and will not be described in detail herein. However, it should be understood that this configuration enables one transistor 12 or 14 (Q1 or Q2) to be switched on and the other transistor to be switched off and vice versa during operation.

As further shown in FIG. 1A, a driving voltage source 20 ($V_{DR}$) is coupled to an input of the gate driver IC. A bootstrap capacitor 22 ($C_B$) is coupled in parallel with the gate driver IC and a bootstrap diode 24 ($D_B$) is coupled between the driving voltage source 20 ($V_{DR}$) and the bootstrap capacitor 22 ($C_B$).

During the periods $t_1$ and $t_2$ (FIG. 1E), when the ground referenced (low side) transistor 14 ($Q_2$) is conducting (indicated in FIGS. 1B and 1C by the current path from driving voltage source 20 ($V_{DR}$) to ground, through transistor 14 (Q2)), the floating bootstrap capacitor 22 ($C_B$) is effectively grounded and the bootstrap capacitor can be charged. Specifically, when the low side transistor 14 ($Q_2$) is conducting, the bootstrap capacitor 22 ($C_B$) is charged to:

$$V_{CB}=V_{DR}-V_{RDB}-V_{DB}+V_{Q2}$$

where $V_{DR}$ is the driver voltage, $V_{DB}$ is the forward drop of the bootstrap diode 24, $V_{RDB}$ is the voltage drop across an optional resistor $R_{DB}$ to limit bootstrap capacitor charging speed, and $V_{Q2}$ is the voltage across the low side transistor 14 ($Q_2$). When the bootstrap capacitor 22 ($C_B$) is fully charged, the bootstrap diode 24 ($D_B$) will begin to block and end the charging cycle.

During the on-cycle of high side transistor 12 ($Q_1$), the bootstrap capacitor 22 ($C_B$), referenced to the driver IC gate return (GR), which is equivalent to the switch node ($V_{SW}$), is used to drive the high side device 12 ($Q_1$) through driver IC gate output (GH). The bootstrap driving period is identified by $t_3$ in FIG. 1E, and the current path is shown in FIG. 1D.

When the low side device 14 ($Q_2$) is driven on, time interval $t_1$, there will be a voltage drop ($V_{\sim0.3}\sim0.7$ V) across the bootstrap diode 24 ($D_B$), and a small voltage generated by the load across $Q_2$, ($I_{LOAD} R_{DS(ON)}$), and the bootstrap capacitor voltage $V_{CB}$, defined in the equation above, will remain below the set driver voltage, $V_{DR}$, and $V_{CB} \approx 4.0\sim4.7$ V, with the capacitor voltage depending on diode and device characteristics and the operating conditions of the circuit (e.g., $I_{LOAD}$). As shown in FIG. 1E, this period, $t_1$, is generally a large portion of the overall period, $T_{SW}=1/f_{SW}$, and the range well defined, and therefore is the intended charging period for the bootstrap capacitor. In the majority of applications, designers seek to minimize the charging times required for the bootstrap capacitor 22 ($C_B$), and no optional charge limiting resistor, $R_{DB}$, is used for standard designs. The bootstrap diode 24 ($D_B$) generally has a large enough equivalent resistive drop to ensure proper charging currents.

During the dead-time, time interval $t_2$, when $Q_1$ and $Q_2$ are both driven off, the "body-diode" function of the e-mode GaN transistor conducts the load current. GaN transistors do not have a p-n junction body diode as is common in silicon MOSFETs. With zero gate-to-source voltage, the GaN transistor has no electrons under the gate region and is off. As the drain voltage decreases, a positive bias on the gate is created, and, when the threshold voltage is reached, there are sufficient electrons under the gate to form a conductive channel. The GaN transistor's majority carrier "body-diode" function has the benefit of no reverse recovery charge, $Q_{RR}$, which is very beneficial in high frequency switching, but produces a larger forward drop than a conventional silicon MOSFET body diode. The larger forward drop will increase the related conduction losses and create an overvoltage condition for an e-mode GaN transistor in a conventional bootstrap drive circuit.

More specifically, during the dead-time, time interval $t_2$, the larger reverse conduction voltage (typically 2-2.5 V) of the low side GaN transistor 14 ($Q_2$), compared to the voltage drop (0.3-0.7 V) of the bootstrap diode 24 ($D_B$), will increase the voltage across the bootstrap capacitor 22 ($C_B$), following the above equation, resulting in the potential overcharging of the bootstrap capacitor 22 ($C_B$) above $V_{DR}$, potentially damaging and limiting the lifetime of the high side transistor 12 ($Q_1$) when it is driven.

The gate-to-source waveforms of a GaN based design with the conventional bootstrapping circuit of FIG. 1A are shown in FIG. 2. For both $t_2$ dead-time conditions ($t_2 \approx 0$ ns and $t_2 \approx 6$ ns), the lower gate voltage, $V_{GS(Q2)}$, remains constant around a $V_{DR}$ driver supply voltage set-point and the waveforms overlap very closely. For the maximum dead-time, the bootstrap capacitor voltage and upper gate, $V_{GS(Q1)}$, is measured to be approximately 6 $V_{DC}$ ($t_2 \approx 6$ ns), well above desired operating range, and the gate reaches an almost 7 V peak in the voltage spike, well above the 6 V maximum peak gate voltage of GaN transistors. For the no load case, where period $t_2$ is eliminated (t2≈0 ns), the bootstrap capacitor voltage is measured to be approximately 4.4 $V_{DC}$, near the intended voltage. Thus, FIG. 2 demonstrates the issue of bootstrap capacitor overcharging during the $t_2$ dead-time period when using a conventional bootstrapping drive method for e-mode GaN transistors.

A number of modified bootstrap drive circuits which avoid the bootstrap capacitor overvoltage condition described above have been proposed in the prior art.

In U.S. Pat. No. 8,593,211, an active clamping switch is inserted in series with the bootstrap diode. During the dead-time $t_2$, the clamping switch is driven off to disconnect the charging path, limiting over-voltage. This design advantageously actively controls bootstrap charging periods. However, such a design adds complexity—an IC must actively monitor and compare various circuit operating conditions, and the additional device (the active clamping switch) introduces higher IC parasitic losses.

Another prior art solution to the above-described over-voltage issue is to insert a Zener diode parallel to the bootstrap capacitor. The Zener diode clamps the voltage across the bootstrap capacitor ($C_B$) when the bootstrap capacitor voltage exceeds the Zener voltage of the diode. Such a solution is simple, requiring the addition of only a single component (a Zener diode) to the circuit. However, clamping is a dissipative method where the over-voltage is dissipated in the Zener. Thus, this circuit has the highest gate drive loss of all prior art solutions.

Another prior art solution to the over-voltage issue is to insert a Schottky diode in parallel with the low side e-mode GaN transistor ($Q_2$). During the dead-time $t_2$, the Schottky diode, which has a much lower forward voltage than the e-mode GaN device ($Q_2$), will conduct, limiting over-voltage. Although adding a Schottky diode in parallel with $Q_2$ limits over-voltage and minimizes power stage losses, the effectiveness of this solution is highly dependent on performance and package parasitics of the Schottky diode. For many applications, e.g. higher voltages and higher currents, there is no suitable Schottky diode and the circuit is not implementable.

Yet another prior art solution is to add not only a Schottky diode, as in the above solution, to provide a low voltage drop path to charge the bootstrap capacitor, but also add a gate resistor to limit the power current that can flow though the Schottky diode, thereby improving the selection of available Schottky diodes. The gate resistor acts as a turn on and turn off resistor for the high side transistor $Q_1$. However, increasing the turn on and turn off resistance significantly increases switching related losses in the $Q_1$ power device and significantly degrades power stage performance. Moreover, especially for high voltage applications, there is no suitable $D_{Q2}$ and the solution is thus limited or not implementable.

Another prior art circuit is a synchronous bootstrap GaN FET, described in U.S. Pat. No. 9,667,245. This circuit, in which the bootstrap diode is replaced with an e-mode GaN transistor that is driven from the gate of $Q_2$, actively regulates over-voltage and minimizes high frequency drive losses. The disadvantage is in the complexity of this circuit. Additional components are required. Moreover, the bootstrap transistor must be a high voltage transistor that can block the full half bridge supply voltage.

Accordingly, a need exists for a drive circuit which avoids the bootstrap capacitor overvoltage condition described above, and also overcomes the deficiencies of the prior solutions described above.

SUMMARY OF THE INVENTION

The present invention provides a modified drive circuit for a half bridge transistor circuit that avoids the gate drive overvoltage condition described above, and overcomes the above-noted deficiencies of the prior art, by providing a shunt diode connected to the bootstrap capacitor at a node $V_B$ between the bootstrap capacitor and ground, the shunt diode being decoupled from the midpoint node of the half bridge ($V_{SW}$) by a shunt resistor. The shunt diode advantageously provides a low voltage drop path to charge the bootstrap capacitor during the dead-time charging period when both the high side and low side transistors of the half bridge are off. The shunt resistor controls and limits the current through the shunt diode.

Advantageously, in the circuit of the present invention, the source of the high side transistor is directly connected to the gate drive return (GR) of the gate driver, eliminating turn off resistance for the turn off commutation of the high side transistor.

The circuit of the present invention is particularly directed to half bridge circuits employing enhancement mode GaN transistors, which, as explained above, have a "body-diode" function that conducts the load current when the transistor is driven off, but with a larger forward voltage drop than a conventional Si MOSFET body diode. The large reverse conduction voltage drop of the GaN transistor will result in overcharging of the bootstrap capacitor. By adding a shunt diode to provide a low voltage drop path for charging the bootstrap capacitor, the present invention avoids an over-voltage condition for the high side GaN transistor.

In a second embodiment of the present invention, a turn on diode is electrically connected in anti-parallel with respect to the shunt resistor. In a third embodiment of the invention, a turn on resistor is provided in series with the turn on diode. In a fourth embodiment of the invention, a second shunt diode is electrically connected in series with the shunt resistor.

BRIEF DESCRIPTION OF THE DRAWINGS

Other features and advantages of the present invention will become apparent when the following description is read in conjunction with the drawings, in which:

FIG. 4A shows a second embodiment of the circuit of the invention with a turn-on diode.

DETAILED DESCRIPTION OF THE PREFERRED EMBODIMENTS

In the following detailed description, reference is made to exemplary embodiments of the present invention. The exemplary embodiments are described with sufficient detail to enable those skilled in the art to practice them. It is to be understood that other embodiments may be employed and that various changes made be made without departing from the scope and spirit of the invention.

Figure 1A:
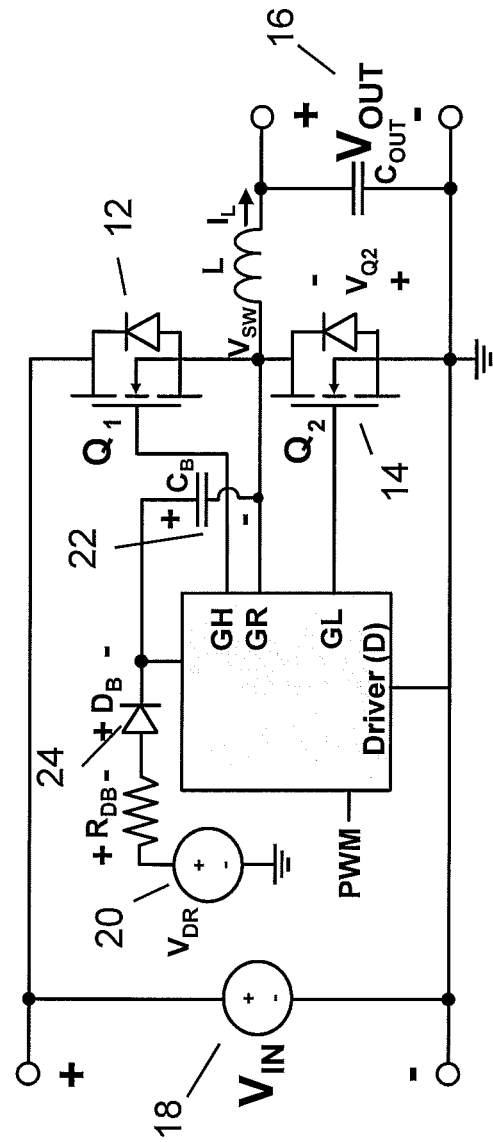
FIG. 1A illustrates a conventional buck converter bootstrap circuit driving e-mode GaN transistors arranged in a half-bridge.
Figure 1B:
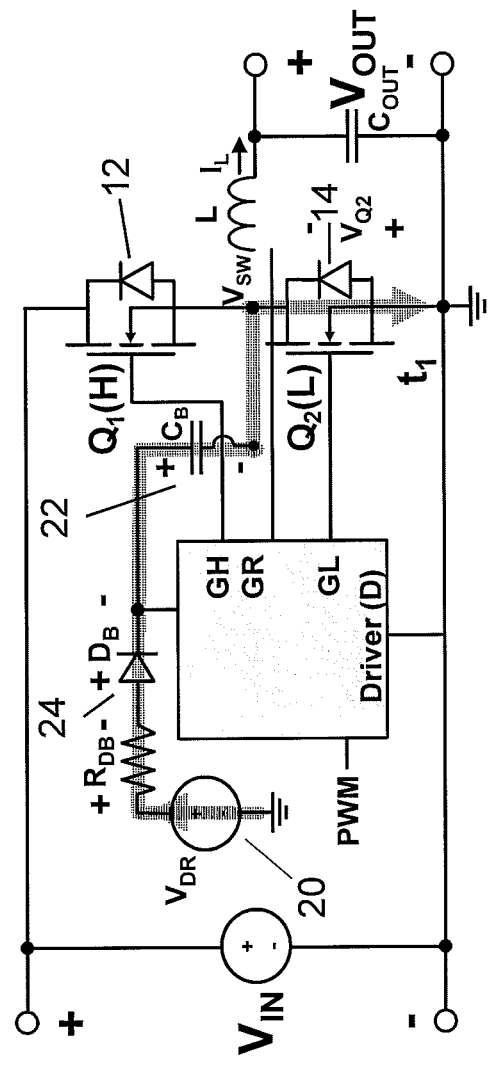
FIGS. 1B-1D show the current paths through the circuit during various time periods.
Figure 1C:
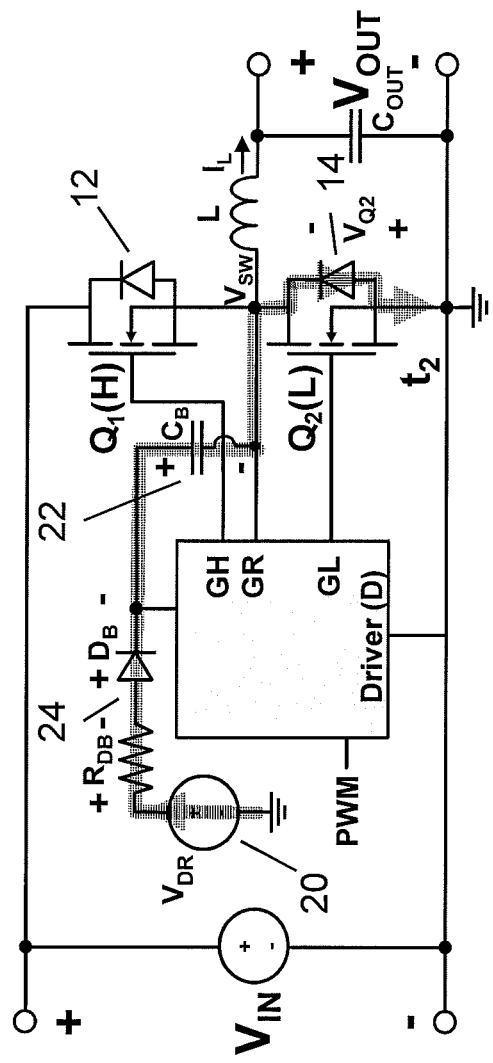
Figure 1D:
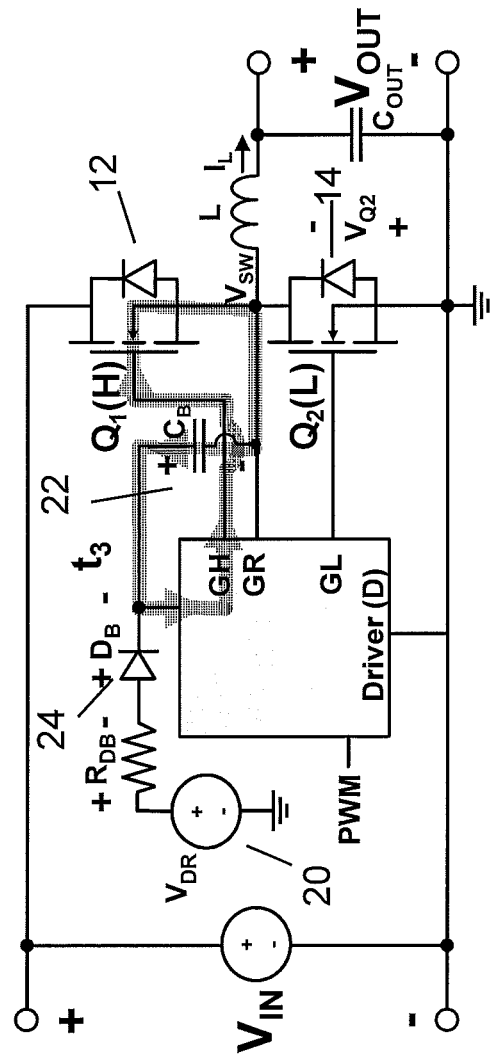
Figure 1E:
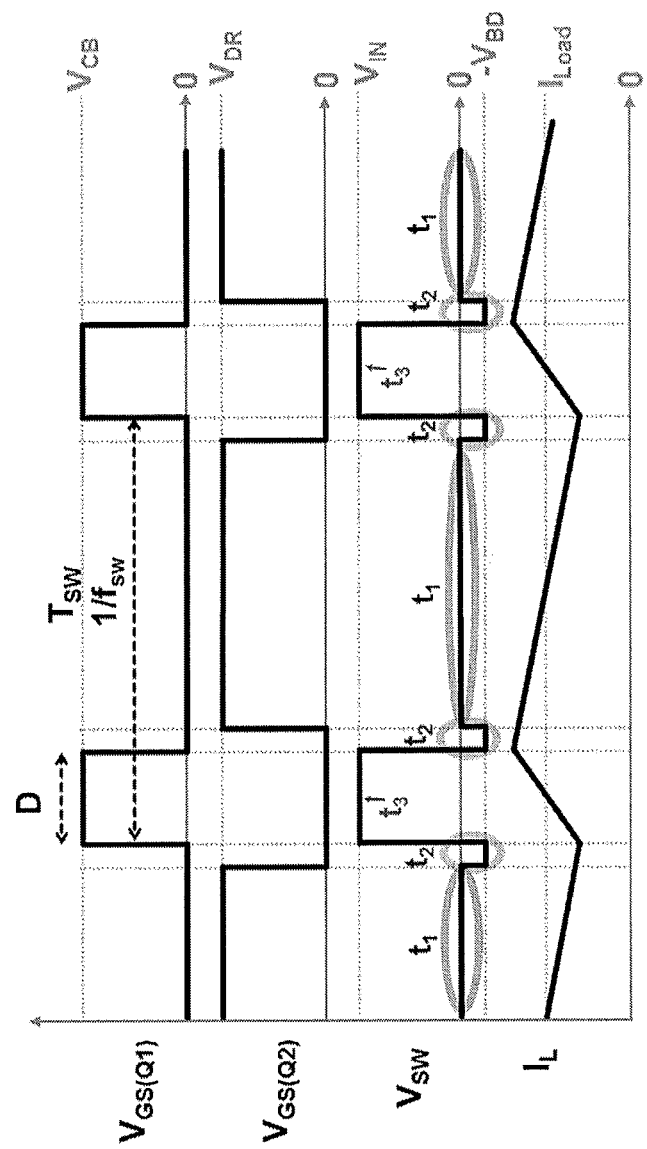
FIG. 1E is timing diagram for the circuit.
Figure 2:
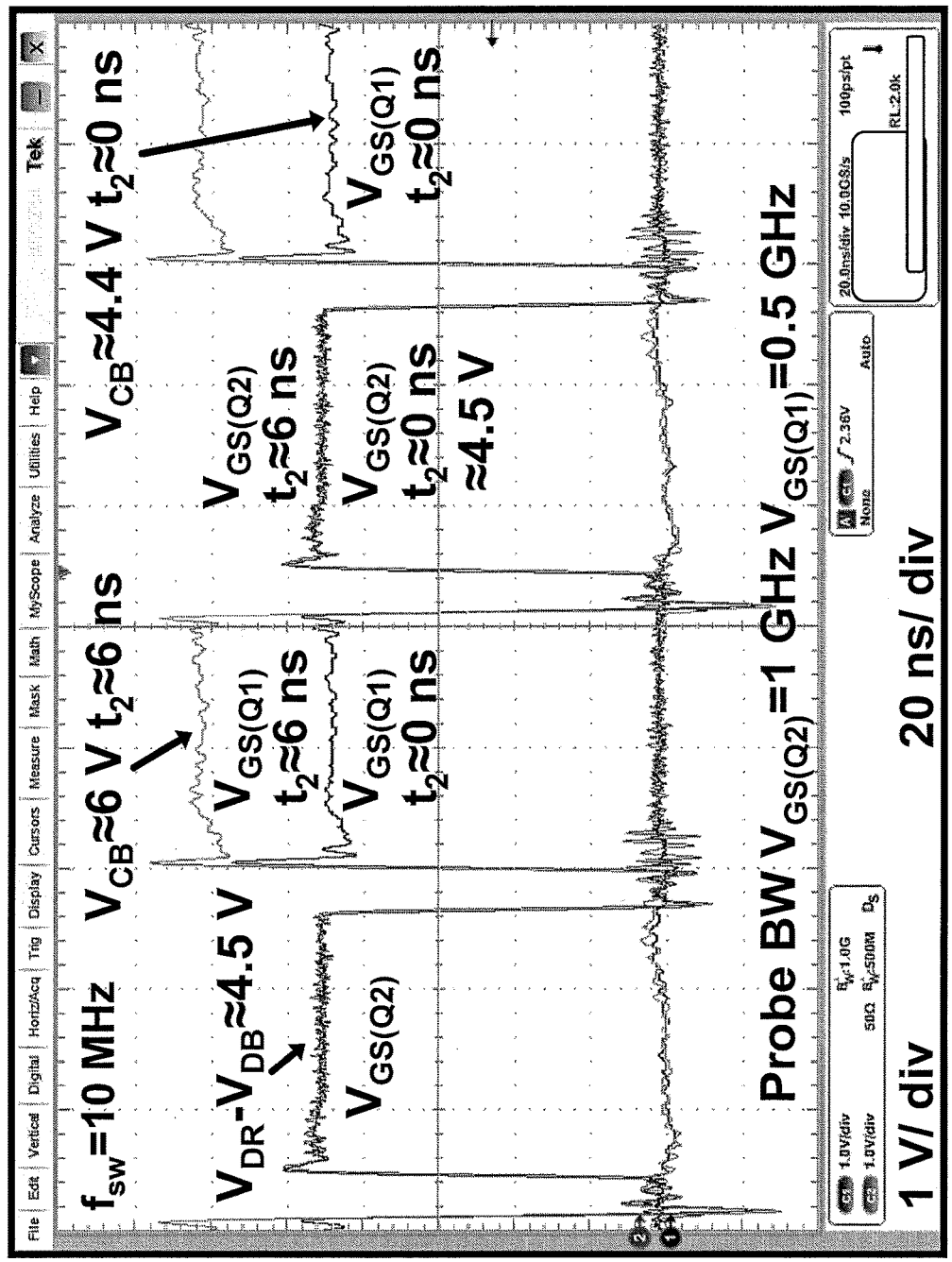
FIG. 2 shows the gate-to-source waveforms of a GaN based design with the conventional bootstrapping circuit of FIG. 1A.
Figure 3A:
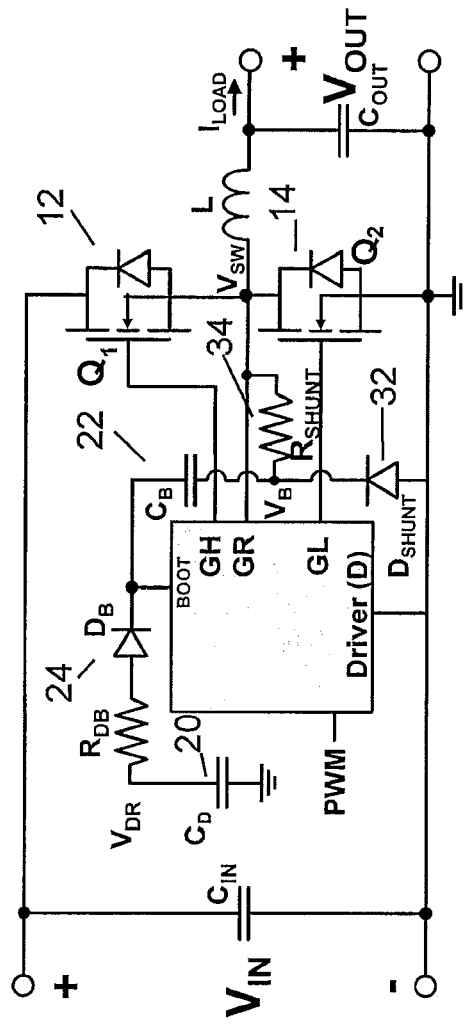
FIG. 3A shows a first embodiment of the circuit of the invention.
Figure 3B:
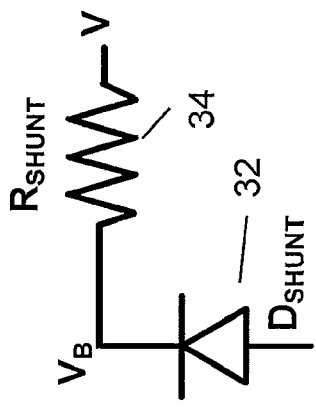
FIG. 3B shows specific details of the first embodiment.

Referring to FIG. 3A, the circuit of the present invention employs a shunt diode 32 ($D_{SHUNT}$), decoupled from the power circuit (node GR/$V_{SW}$) by a shunt resistor 34 ($R_{SHUNT}$), and connected at its cathode to a node $V_B$, to provide a low voltage drop path to charge bootstrap capacitor 22 ($C_B$) during the dead-time charging period $t_2$. Shunt resistor 34 ($R_{SHUNT}$) controls and limits the current through shunt diode 32 ($D_{SHUNT}$).

Advantageously, the source of the high side GaN transistor 12 ($Q_1$) is directly connected to the gate drive return (GR), eliminating turn off resistance for the turn off commutation of high side GaN transistor 12 ($Q_1$).

Shunt diode 32 ($D_{SHUNT}$) can be designed/selected to have similar or the same characteristics as bootstrap diode 24 ($D_B$) to provide a bootstrap capacitor voltage $V_{CB}$ closest to the drive voltage $V_{DR}$. Alternatively, shunt diode 32 ($D_{SHUNT}$) can be designed/selected to have different characteristics from bootstrap diode 24 ($D_B$) to create voltages above and/or below the drive voltage $V_{DR}$. Shunt diode 32 ($D_{SHUNT}$) can be implemented with either a conventional or a Schottky diode, but must have the voltage capability to support $V_{IN}$.

Figure 3C:
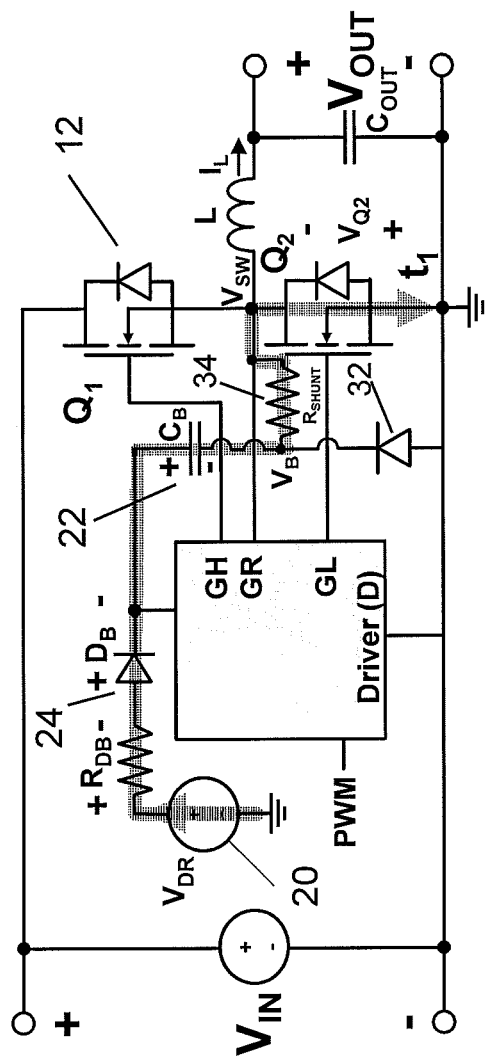
FIGS. 3C-3E show the current paths during various time periods.
Figure 3D:
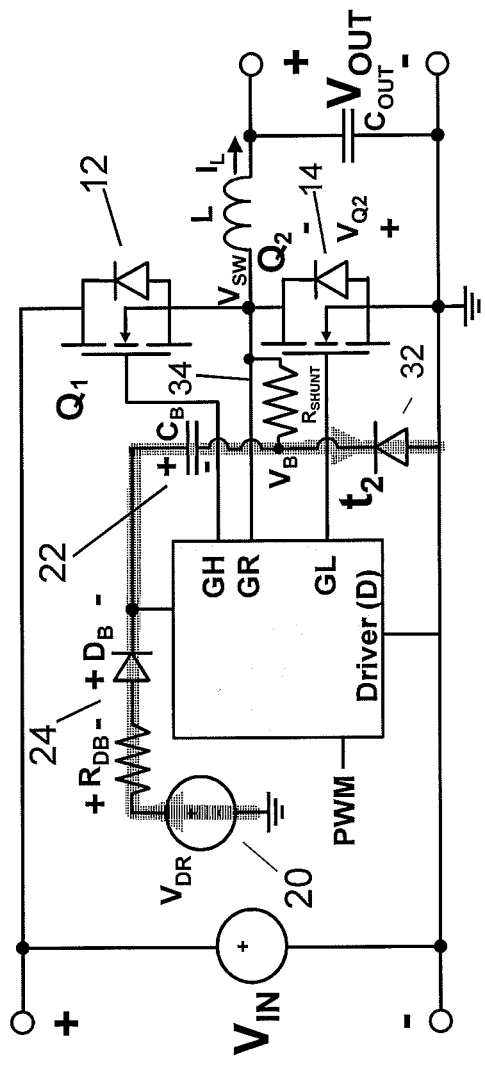
Figure 3E:
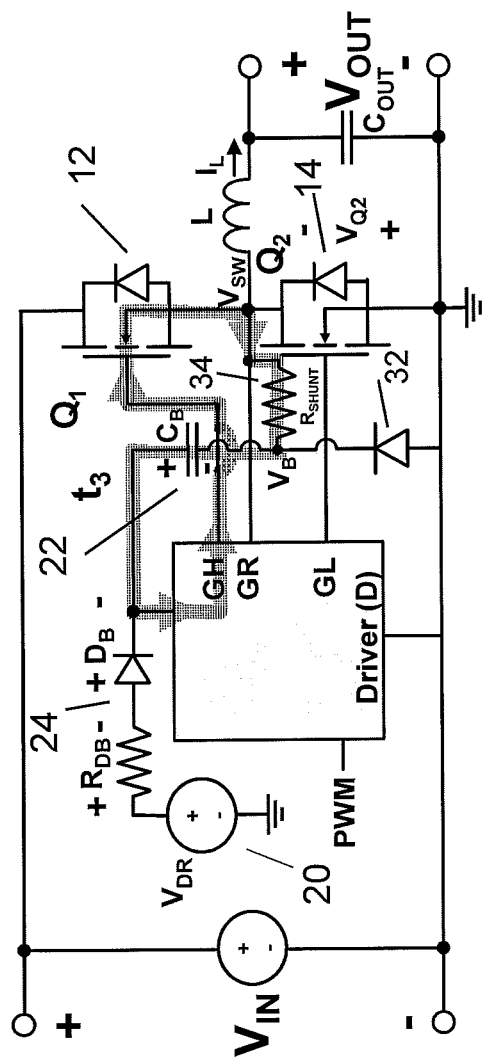

Referring to FIG. 3C, in the operation of the circuit of FIG. 3A, during period $t_1$, as in the prior art, the power transistor $Q_2$ is driven on and has a low impedance and voltage drop, and the bootstrap capacitor charging path is through $Q_2$, making the shunt network inactive with shunt diode 32 ($D_{SHUNT}$) blocking. As shown in FIG. 3D, during period $t_2$, the power transistors $Q_1$ and $Q_2$ are driven off and $Q_2$ has a high voltage drop, making the shunt network active with shunt diode 32 ($D_{SHUNT}$) conducting. The bootstrap capacitor charging path is thus through shunt diode 32 ($D_{SHUNT}$), rather than through $Q_2$. As shown in FIG. 3E, during period $t_3$, the power transistor $Q_1$ is driven on by the bootstrap capacitor and the $D_{SHUNT}$ network is inactive.

The circuit of the present invention is advantageous over the above-described prior art circuits for a number of reasons. First, the shunt diode 32 ($D_{SHUNT}$) is not required to be a Schottky diode as in the prior art circuits described above, making the present invention suitable for a greater number of applications. Second, the decoupling of shunt resistor 34 ($R_{SHUNT}$) from the power circuit, which is not done is the above-described prior art circuit with a gate resistor, allows $R_{SHUNT}$ to be designed independently to optimize the current handled by $D_{SHUNT}$ without impacting the turn off commutation of $Q_1$, improving power stage performance. The present invention is significantly simpler than the active clamping switch and synchronous bootstrap circuits described above. Finally, the present invention is significantly better performing than the prior art Zener diode solution described above, because shunt diode 32 is not dissipative.

Figure 4B:
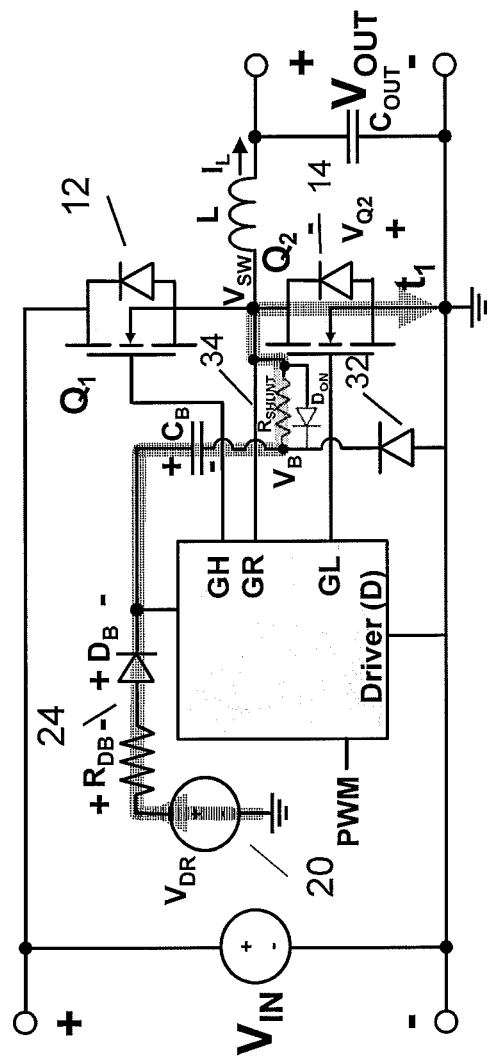
FIGS. 4B-4D show the current paths during various time periods.
Figure 4C:
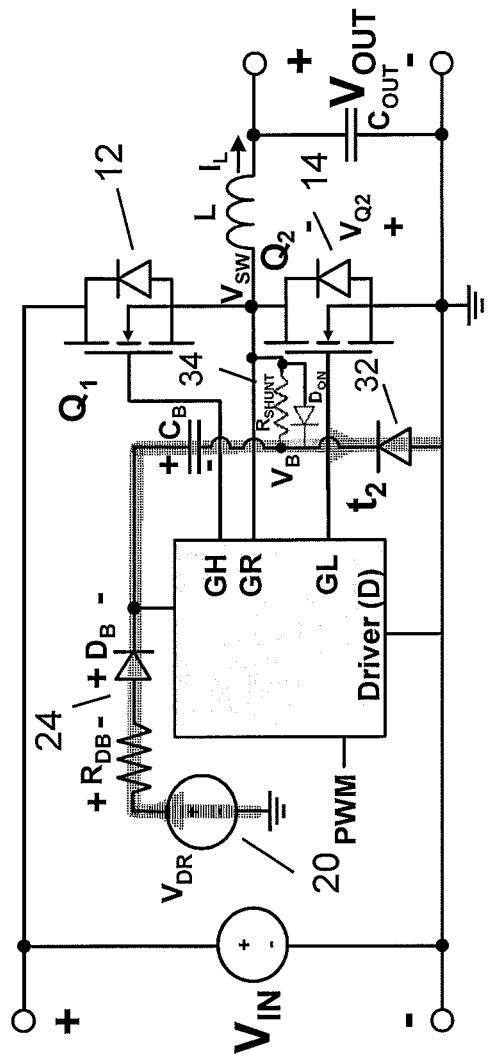
Figure 4D:
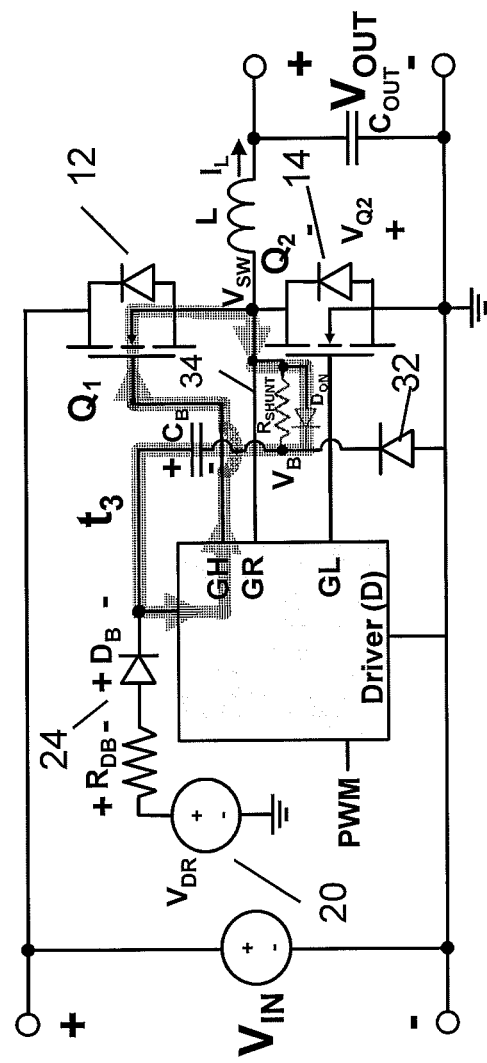
Figure 4E:
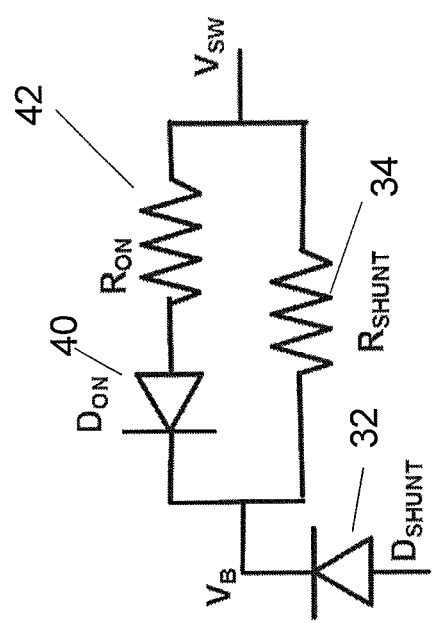
FIG. 4E shows the addition of an optional turn-on resistor.

A disadvantage of the circuit of the present invention shown in FIG. 3A is that the shunt resistor 34 ($R_{SHUNT}$) acts as a turn on resistor, impacting the turn on commutation of low side transistor $Q_1$. Accordingly, as shown in FIG. 4A, in a second embodiment of the invention, to improve the turn on speed of the embodiment of FIG. 3A, an antiparallel turn-on diode 40 ($D_{ON}$), for turn on of $Q_1$, is provided. In the second embodiment, during the $t_2$ dead-time period (shown in FIG. 4C), the $R_{SHUNT}$ branch will be active, controlling the current conducted through shunt diode 32 ($D_{SHUNT}$) and limiting bootstrap capacitor charging. As shown in FIG. 4D, during the $t_3$ turn on period, the $D_{ON}$ branch will be active, providing a low impedance path to improve the turn on speed of transistor $Q_1$. Advantageously, the second embodiment of FIG. 4A has no resistances in the turn on or turn off path of $Q_1$, providing the best capable switching performance of the power device, while using the $R_{SHUNT}/D_{SHUNT}$ network to manage the bootstrap capacitor over-voltage. Accordingly, unlike the first embodiment shown in FIG. 3A, in the second embodiment of FIG. 4A, the shunt resistor 34 has no impact on power switching of high side transistor $Q_1$. Optionally, as shown in FIG. 4E, a series resistor 42 (RON) can be added to provide a turn-on resistor.

Figure 5:
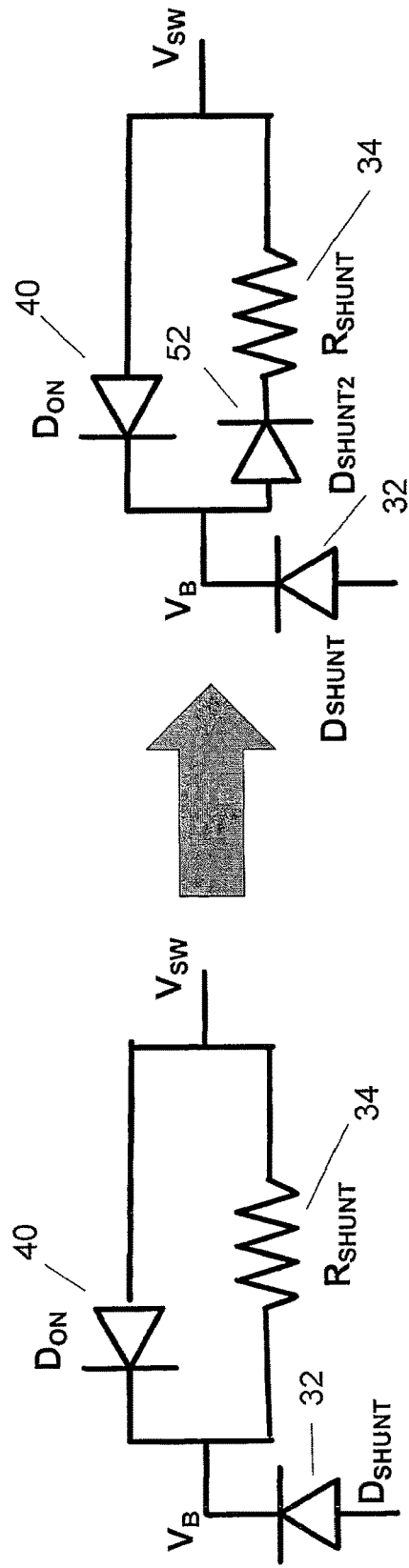
FIG. 5 shows a third embodiment of the circuit of the invention with a second shunt diode.

In a third embodiment of the invention, shown in FIG. 5, a second shunt diode 52 ($D_{SHUNT2}$) is inserted in series with shunt resistor ($R_{SHUNT}$) to provide additional control over the effective impedance and voltage drop.

Figure 6:
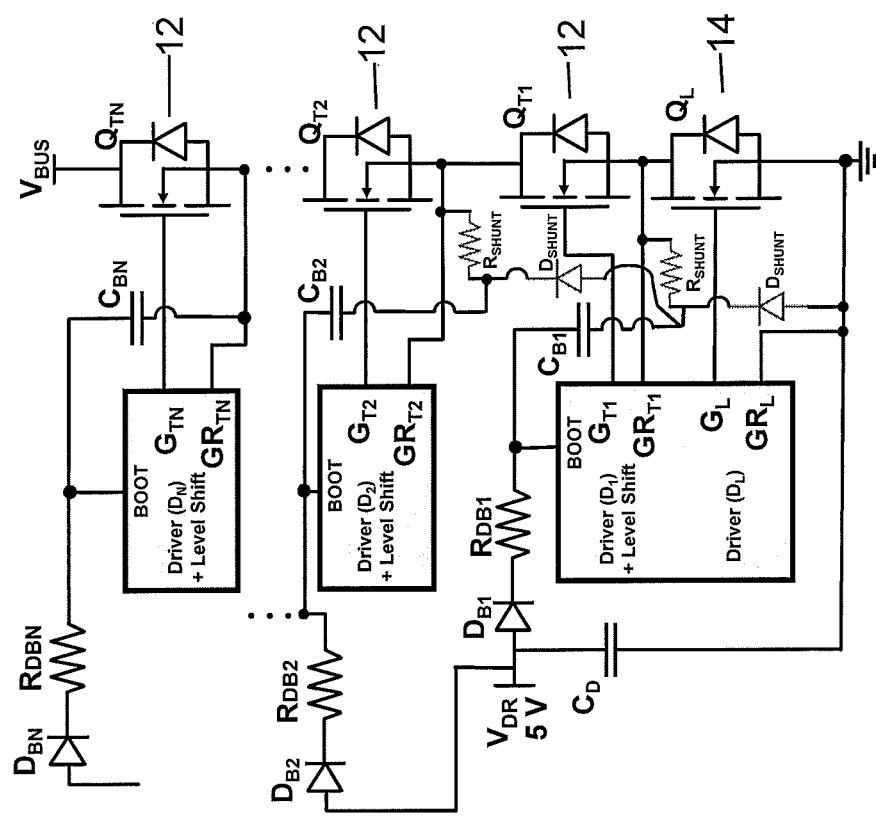
FIG. 6 shows a fourth embodiment of the invention, in which the invention is extended to converters with a higher number of levels.

As shown in FIG. 6, in a fourth embodiment, the present invention is extended to converters with a higher number of levels. The implementation of the first embodiment of the present invention is shown in FIG. 6, but the other embodiments of the invention described herein can also be extended to converters with a higher number of levels in a similar fashion.

Figure 7A:
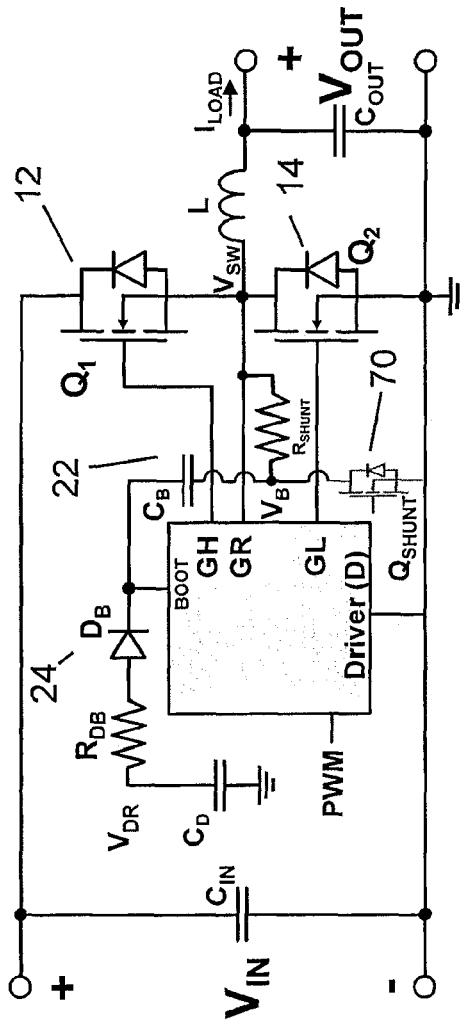
FIG. 7A shows a fifth embodiment of the circuit of the invention with a shunt transistor substituted for the shunt diode.
Figure 7B:
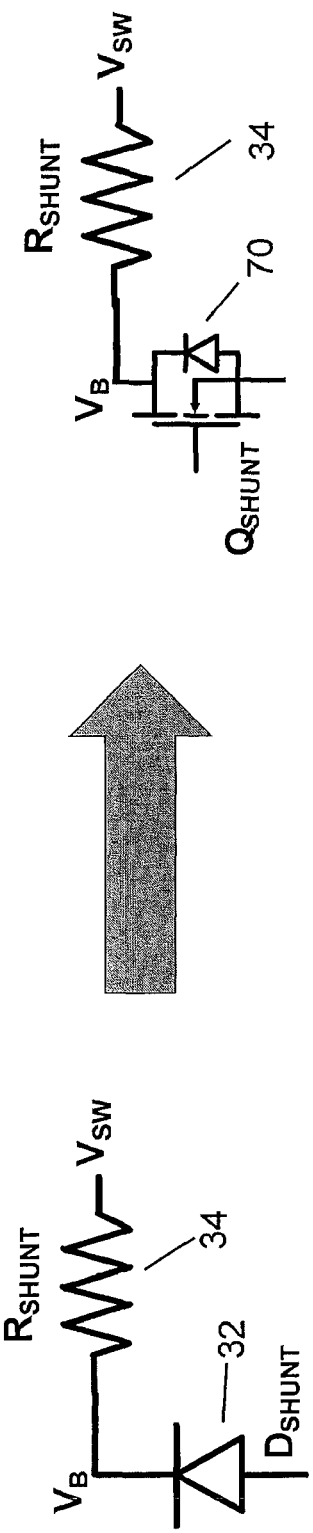
FIG. 7B shows specific details of the fifth embodiment.

In a fifth embodiment of the present invention, shown in FIGS. 7A and 7B, shunt diode 32 ($D_{SHUNT}$) can be replaced with an active semiconductor, i.e., transistor 70 ($Q_{SHUNT}$), which is driven with the complementary gate drive signal of transistor 12 ($Q_1$). U.S. Pat. No. 8,536,847, incorporated by reference herein, discloses a circuit in which a transistor $Q_3$ is employed in a similar fashion in a bootstrap drive circuit, but the circuit of this patent requires a complicated reference voltage circuit because the power pin and the gate drive pin are referenced to different potentials. If referenced at same potential, there would be no balancing method to limit power current from conducting in the smaller $Q_3$. In contrast, in the present invention, the shunt resistor 34 ($R_{SHUNT}$) simply provides impedance to control the charging ratio between transistor 70 ($Q_{SHUNT}$) and low side transistor 14 ($Q_2$), which are both referenced to GND, while allowing a direct connection of the power and gate drive pins, without requiring a reference voltage circuit.

The circuit of the present invention, in its various embodiments described above, can be implemented discretely or fully integrated monolithically into a single integrated circuit. The various diodes of the circuit can be implemented as active switches. The gate drive circuit of the present invention can also be integrated in a chip with the power devices and passive components.

The above description and drawings are only to be considered illustrative of specific embodiments which achieve the features and advantages described herein. Modifications and substitutions to specific circuits will be obvious to those skilled in the art. Accordingly, the embodiments of the invention are not considered as being limited by the foregoing description and drawings.

What is claimed is:

1. An electrical circuit arranged in a half bridge topology, comprising:
    a high side transistor and a low side transistor, each having a source, a drain and a gate, the source of the high side transistor being electrically connected to the drain of the low side transistor at a first node;
    a gate driver electrically coupled to the gate of the high side transistor;
    a bootstrap capacitor electrically coupled in parallel with the gate driver;
    a shunt diode having a cathode and an anode, the cathode of the shunt diode being connected to the capacitor at a second node, and the anode of the shunt diode being connected to ground, the shunt diode providing a low voltage drop path to charge the bootstrap capacitor; and
    a shunt resistor electrically connected between the first node and the second node, to decouple the shunt diode from the first node, and to control and limit current through the shunt diode.

2. The electrical circuit of claim 1, wherein the high side and low side transistors are enhancement mode GaN transistors.

3. The electrical circuit of claim 1, further comprising a turn on diode electrically connected in anti-parallel with the shunt resistor.

4. The electrical circuit of claim 3, further comprising a turn on resistor in series with the turn on diode.

5. The electrical circuit of claim 3, further comprising a second shunt diode, the second shunt diode connected in series with the shunt resistor.

6. The electrical circuit of claim 1, further comprising additional shunt diodes and shunt resistors connected to respective sources of additional high side transistors.

7. The electrical circuit of claim 1, wherein the shunt diode is substituted with a shunt transistor, the shunt transistor being driven with a gate drive signal that is complementary to the signal applied to the gate of the low side transistor.

8. The electrical circuit of claim 1, wherein the gate driver, the bootstrap capacitor, the shunt diode and the shunt resistor are all fully integrated monolithically into a single integrated circuit.

9. The electrical circuit of claim 1, wherein the integrated circuit includes the high side and low side transistors and passive components of the circuit.

10. A method of avoiding gate drive overvoltage in an electrical circuit arranged in a half bridge configuration, wherein the half bridge of the electrical circuit comprises a high side transistor and a low side transistor, each having a source, a drain and a gate, the source of the high side transistor being electrically connected to the drain of the low side transistor at a first node, and the electrical circuit further comprises a gate driver electrically coupled to the gate of the high side transistor, and a bootstrap capacitor electrically coupled in parallel with the gate driver, wherein the method comprises charging the bootstrap capacitor, when both the high side and low side transistors are off, through a shunt network electrically connected in parallel to the low side transistor, the shunt network providing a low voltage drop charging path as compared to the reverse voltage drop of the low side transistor, wherein the shunt network comprises:
    a shunt diode having a cathode and an anode, the cathode of the shunt diode being connected to the capacitor at a second node, and the anode of the shunt diode being connected to ground, and
    a shunt resistor electrically connected between the first node and the second node to decouple the shunt diode from the first node, and to control and limit current through the shunt diode.

11. The method of claim 10, wherein the high side and low side transistors are enhancement mode GaN transistors.

12. The method of claim 10, wherein the shunt network further comprises a turn on diode electrically connected in anti-parallel with respect to the shunt resistor.

13. The method of claim 10, wherein the shunt network further comprises a turn on resistor in series with the turn on diode.

14. The method of claim 13, further comprising a second shunt diode, the second shunt diode being disposed in series with the shunt resistor.

15. The method of claim 10, wherein the shunt diode is substituted with a shunt transistor, and the shunt transistor is driven with a gate drive signal that is complementary to the signal applied to the gate of the low side transistor.

* * * * *